(12) United States Patent
Chen et al.

(10) Patent No.: US 9,562,947 B2
(45) Date of Patent: Feb. 7, 2017

(54) TESTING APPARATUS FOR PROVIDING PER PIN LEVEL SETTING

(71) Applicant: Test Research, Inc., Taipei (TW)

(72) Inventors: Hsin-Hao Chen, Taipei (TW); Po-Shen Kuo, Taipei (TW)

(73) Assignee: Test Research, Inc., Taipei (TW)

( * ) Notice: Subject to any disclaimer, the term of this patent is extended or adjusted under 35 U.S.C. 154(b) by 211 days.

(21) Appl. No.: 13/897,239

(22) Filed: May 17, 2013

(65) Prior Publication Data

US 2014/0285228 A1    Sep. 25, 2014

(30) Foreign Application Priority Data

Mar. 25, 2013  (TW) .............................. 102110515 A

(51) Int. Cl.

| G01R 31/00 | (2006.01) |
| G01R 31/319 | (2006.01) |
| G01R 31/28 | (2006.01) |
| G01R 1/073 | (2006.01) |
| G01R 1/04 | (2006.01) |
| G01R 31/327 | (2006.01) |

(52) U.S. Cl.
CPC ....... *G01R 31/31924* (2013.01); *G01R 1/0466* (2013.01); *G01R 1/07314* (2013.01); *G01R 31/2879* (2013.01); *G01R 31/2886* (2013.01); *G01R 31/2889* (2013.01); *G01R 31/327* (2013.01)

(58) Field of Classification Search
CPC . G01R 1/07307; G01R 31/327; G01R 1/0466; G01R 1/07314; G01R 31/2879; G01R 31/2886; G01R 31/2889; G01R 31/2896; G05F 1/00
USPC ..... 324/500, 537, 554, 700, 756.01, 756.02; 361/93.1
See application file for complete search history.

(56) References Cited

U.S. PATENT DOCUMENTS

| 4,862,069 | A | * | 8/1989 | Albee | .......................... 324/73.1 |
| 4,877,979 | A | * | 10/1989 | Sempel | ......................... 327/555 |
| 5,691,605 | A | * | 11/1997 | Xia | ..................... H05B 37/0263 |
| | | | | | 315/224 |
| 6,175,230 | B1 | | 1/2001 | Hamblin et al. | |
| 6,836,136 | B2 | | 12/2004 | Aghaeepour | |
| 7,129,746 | B1 | * | 10/2006 | Balasubramanian | .. G01K 7/015 |
| | | | | | 326/26 |
| 7,298,309 | B1 | | 11/2007 | Wu et al. | |
| 7,446,320 | B1 | | 11/2008 | McCord et al. | |
| 2002/0060602 | A1 | * | 5/2002 | Ghia | ....................... H03K 5/151 |
| | | | | | 327/543 |
| 2004/0036500 | A1 | * | 2/2004 | Bratt | ......................... G06F 1/08 |
| | | | | | 326/39 |
| 2004/0046761 | A1 | * | 3/2004 | Hellman | ............. G06F 9/30043 |
| | | | | | 345/502 |

(Continued)

FOREIGN PATENT DOCUMENTS

| CN | 1786728 A | | 6/2006 | |
| CN | 1901338 | * | 1/2007 | .............. H02M 1/00 |

(Continued)

OTHER PUBLICATIONS

CN 1901338 Machine Translation, Jan. 24, 2007.*

*Primary Examiner* — Huy Q Phan
*Assistant Examiner* — Raul Rios Russo
(74) *Attorney, Agent, or Firm* — CKC & Partners Co., Ltd.

(57) ABSTRACT

A testing apparatus for providing per pin level setting is disclosed, and the testing apparatus includes a control unit and a filter circuit, where the control unit is electrically connected to the filter circuit. The control unit includes a field programmable gate array (FPGA) for providing a PWM signal. The filter circuit receives the PWM signal and outputs at least one DC voltage.

5 Claims, 3 Drawing Sheets

(56) References Cited

U.S. PATENT DOCUMENTS

| | | | |
|---|---|---|---|
| 2005/0253165 A1* | 11/2005 | Pace | H02M 7/538 257/139 |
| 2005/0281066 A1* | 12/2005 | Wheeler | H02M 5/293 363/131 |
| 2007/0024265 A1 | 2/2007 | Higgins | |
| 2007/0234145 A1* | 10/2007 | Baker et al. | 714/724 |
| 2009/0026977 A1* | 1/2009 | Omi | H02M 1/36 315/294 |
| 2009/0033243 A1* | 2/2009 | Gater | H05B 33/0848 315/291 |
| 2010/0262877 A1* | 10/2010 | Narayan | G01R 31/318572 714/727 |
| 2010/0283441 A1* | 11/2010 | Wang et al. | 323/282 |
| 2011/0140725 A1* | 6/2011 | Xie | 324/750.3 |
| 2011/0279103 A1* | 11/2011 | Lee et al. | 323/282 |
| 2013/0069753 A1* | 3/2013 | Kurs et al. | 336/200 |
| 2013/0320856 A1* | 12/2013 | Lin et al. | 315/119 |

FOREIGN PATENT DOCUMENTS

| | | | |
|---|---|---|---|
| CN | 101587167 | A | 11/2009 |
| CN | 101592707 | A | 12/2009 |
| CN | 201434900 | Y | 3/2010 |
| CN | 201434902 | Y | 3/2010 |
| JP | 2008128711 | A | 6/2008 |
| TW | 200403445 | A | 3/2004 |
| TW | 201134083 | A | 10/2011 |

* cited by examiner

TESTING APPARATUS FOR PROVIDING PER PIN LEVEL SETTING

RELATED APPLICATIONS

This application claims priority to Taiwan Application Serial Number 102110515, filed Mar. 25, 2013, which is herein incorporated by reference.

BACKGROUND

Technical Field

The present disclosure relates to electronic equipment, and more particularly, a testing apparatus.

Description of Related Art

For a pin card of a testing apparatus, a digital-to-analog conversion (DAC) IC is utilized to set voltages (e.g., Vih/Vterm/Voh/Vol) of a pin driver and pin receiver. When the pin card is in a per group architecture, a plurality of pin drivers and pin receivers serve as a group, the same voltages are set for the group of the pin drivers and pin receivers, and therefore the number of DAC ICs is not too much. When the pin card is in a per pin architecture, varied voltages can be set for respective pin drivers and pin receivers individually, and therefore the number of DAC ICs is increased; accordingly, the cost of the pin card is increased adversely.

In view of the foregoing, there exist problems and disadvantages in the current apparatus that waits further improvement. However, those skilled in the art sought vainly for a solution. In order to solve or circumvent above problems and disadvantages, there is an urgent need in the related field to reduce the cost effectively.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more various aspects, the present disclosure is directed to a testing apparatus for providing per pin level setting, so as to solve or circumvent aforesaid problems.

According to one embodiment of the present disclosure, a testing apparatus includes a control unit and a filter circuit. The filter circuit is electrically connected to the control unit. The control unit includes a field programmable gate array (FPGA) for providing a pulse width modulation (PWM) signal. The filter circuit receives the PWM signal and outputs at least one direct current (DC) voltage.

The testing apparatus further includes a pin driver and pin receiver. The pin driver and pin receiver is electrically connected to the filter circuit for receiving the DC voltage so as to test a tested circuit.

The control unit further includes at least one inverter. The inverter is electrically connected to the FPGA for transmitting the PWM signal to the filter circuit.

In addition, the filter circuit is a low-pass filter for attenuating a high frequency portion of the PWM signal and outputting the DC voltage.

Moreover, the low-pass filter is a RC low-pass filter.

The RC low-pass filter includes a first resistor, a first capacitor, a second resistor and a second capacitor. A first terminal of the first resistor is connected to an output terminal of the control unit. A first terminal of the first capacitor is connected to a second terminal of the first resistor, and a second terminal of the first capacitor is grounded. A first terminal of the second resistor is connected to the first terminal of the first capacitor. A first terminal of the second capacitor is connected to a second terminal of the second resistor and a load, and a second terminal of the second capacitor is grounded.

Technical advantages are generally achieved, by embodiments of the present invention, as follows:

1. A low-cost FPGA can be utilized to set the voltage of the pin driver and pin receiver in the per pin architecture, so that the cost of the pin card in the per pin architecture can be reduced; and 2. The occupied area of voltage setting on a printed circuit board (PCB) can be decreased compared to DAC-based method.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
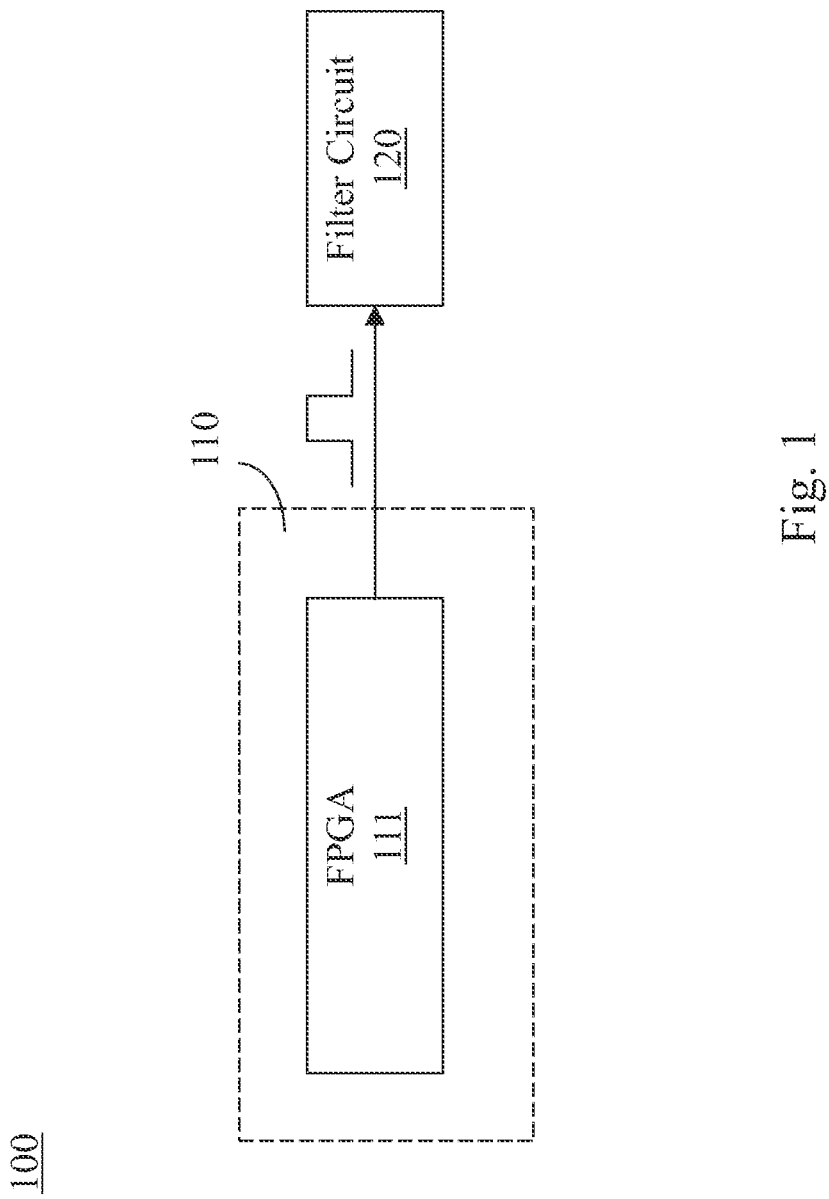
FIG. 1 is a block diagram of a testing apparatus for providing per pin level setting according to one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one aspect, the present invention is directed to a testing apparatus for providing per pin level setting. This testing apparatus may be easily applied in circuit test, and may be applicable or readily adaptable to all related technology. It should be noted that a field programmable gate array (FPGA) is configured in the testing apparatus to accomplish the output of a pulse width modulation (PWM) signal. For a more complete understanding of the testing apparatus apparatus, and the advantages thereof, please refer to FIGS. 1-3 and embodiments of the present disclosure.

FIG. 1 is a block diagram of a testing apparatus 100 for providing per pin level setting according to one embodiment of the present disclosure. As shown in FIG. 1, the testing apparatus 100 includes a control unit 110 and a filter circuit 120. The filter circuit 120 is electrically connected to the control unit 110. The control unit 110 includes a FPGA 111 for providing a PWM signal; the filter circuit 120 receives the PWM signal and outputs at least one direct current (DC) voltage. In the present disclosure, an expensive DAC IC can be replaced with a low-cost FPGA, so as to reduce the cost.

In one embodiment, the filter circuit 120 is a low-pass filter. The low-pass filter can attenuate a high frequency portion of the PWM signal and outputs the DC voltage. In practice, when the frequency of the PWM signal is relatively high, the ripple of the DC voltage is relatively small. In contrast, when the frequency of the PWM signal is relatively low, the ripple of the DC voltage is relatively large. When the duty cycle of the PWM signal is relatively long (e.g., 246/256) or relatively short (e.g., 10/256), the ripple of the DC voltage is relatively small. In contrast, when the duty cycle of the PWM signal is relatively close to a median (e.g., 128/256), the ripple of the DC voltage is relatively large. Those with ordinary skill in the art may flexibly choose the frequency and duty cycle of the PWM signal of the FPGA 111 depending on the desired application.

Figure 2:
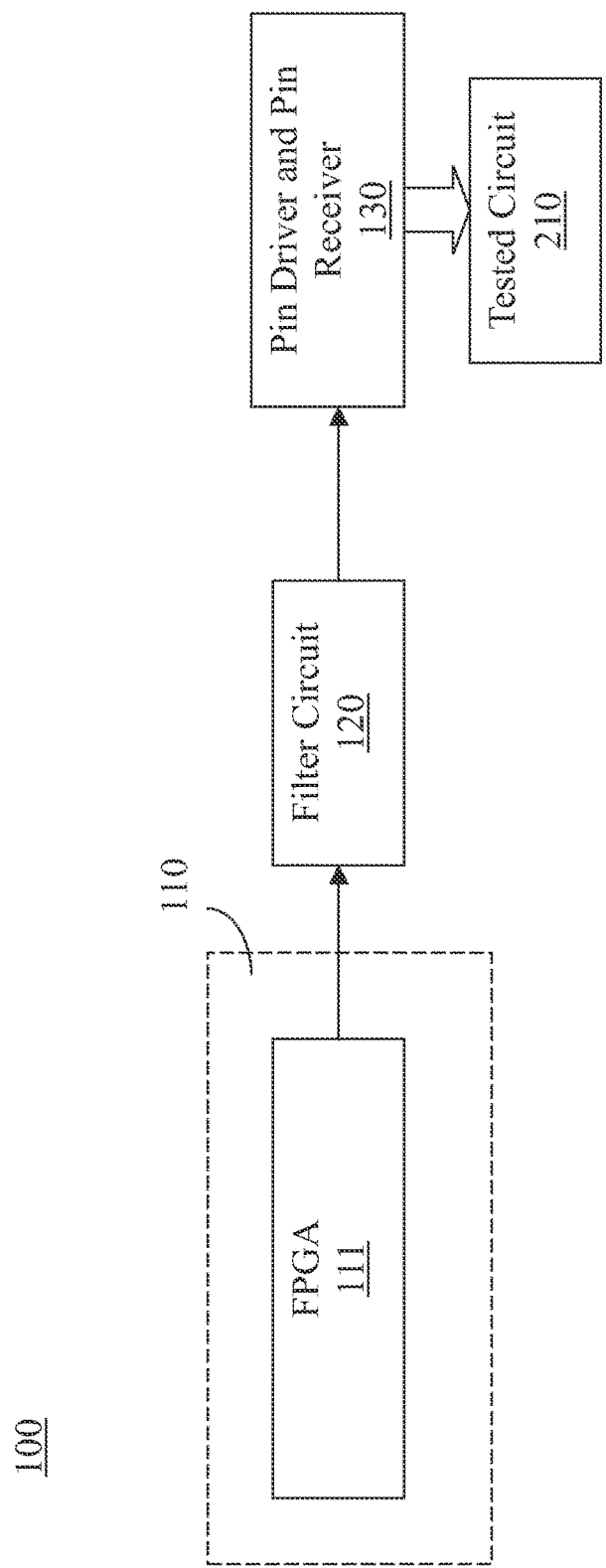
FIG. 2 is a block diagram of the testing apparatus for providing per pin level setting according to another embodiment of the present disclosure.

FIG. 2 is a block diagram of the testing apparatus 100 for providing per pin level setting according to another embodiment of the present disclosure. As shown in FIG. 2, the testing apparatus 100 not only includes the FPGA 111 and the filter circuit 120 but also includes a pin driver and pin receiver 130. The pin driver and pin receiver 130 is electrically connected to the filter circuit 120. In use, the pin driver and pin receiver 130 receives the DC voltage from the filter circuit 120, so as to test a tested circuit 210. Thus, the FPGA can be configured to set the voltages (e.g., Vih/Vterm/Voh/Vol) of the pin driver and pin receiver 130. Moreover, it should be noted that the hardware configured in the pin driver and pin receiver 130 are well known in the art and, thus, are not repeated herein.

Figure 3:
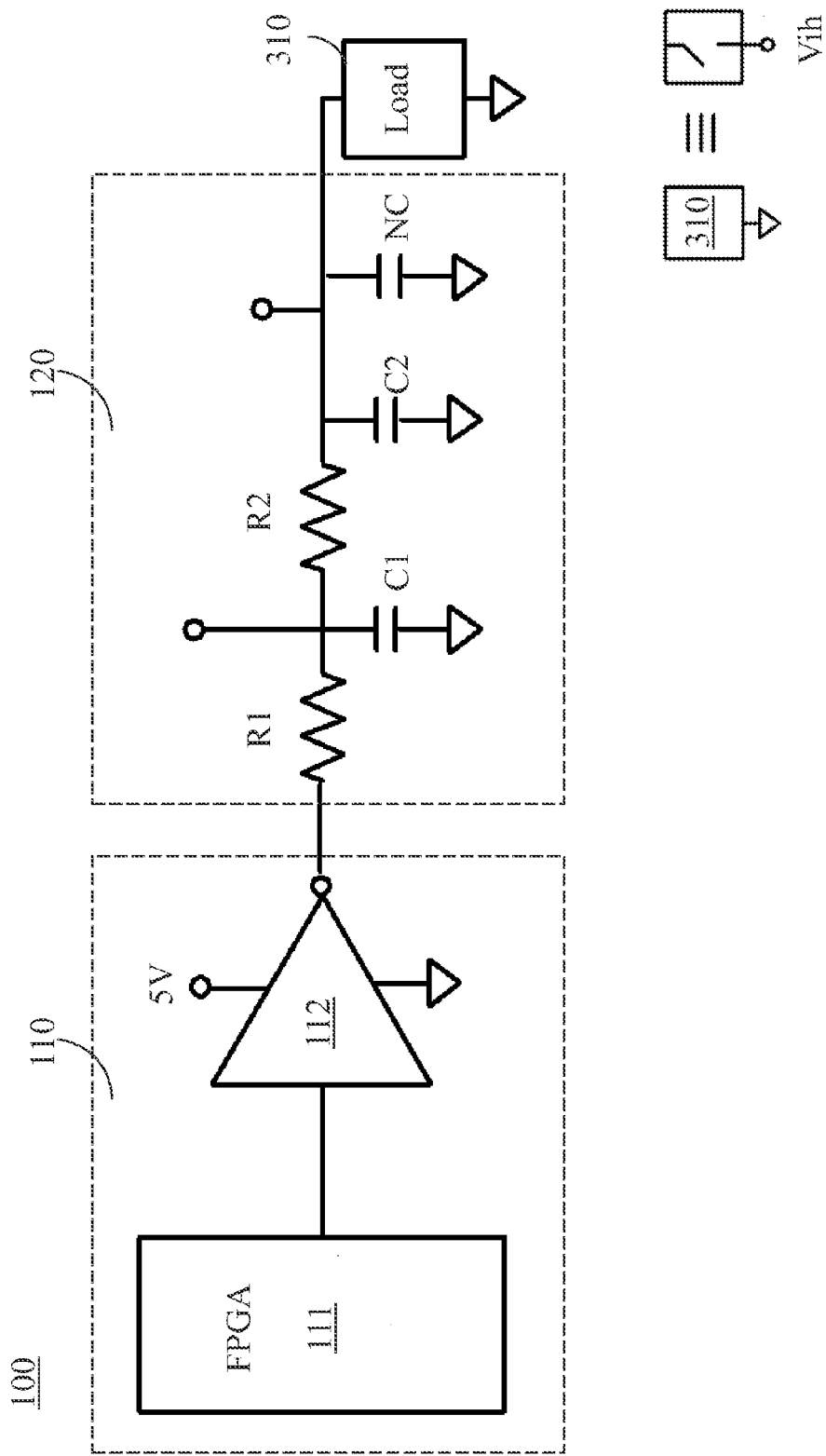
FIG. 3 is a circuit diagram of the testing apparatus for providing per pin level setting according to yet another embodiment of the present disclosure.

FIG. 3 is a circuit diagram of the testing apparatus for providing per pin level setting according to yet another embodiment of the present disclosure. As shown in FIG. 3, the testing apparatus 100 includes at least one inverter 112. The inverter 112 is electrically connected to the FPGA 111. The inverter 112 transmits the PWM signal to the filter circuit 120. For example, the product model of the inverter 112 may be 74AC04. In an alternative embodiment, the inverter 112 can be omitted. Those with ordinary skill in the art may selectively decide whether the inverter 112 is needed depending on the desired application.

In addition, the filter circuit 120 is a low-pass filter. Specifically, the low-pass filter is a RC low-pass filter.

The RC low-pass filter includes a first resistor R1, a first capacitor C1, a second resistor R2 and a second capacitor C2. A first terminal of the first resistor R1 is connected to an output terminal of the control unit 110. A first terminal of the first capacitor C1 is connected to a second terminal of the first resistor R1, and a second terminal of the first capacitor C1 is grounded. A first terminal of the second resistor R2 is connected to the first terminal of the first capacitor C1. A first terminal of the second capacitor C2 is connected to a second terminal of the second resistor R2 and a load 310, and a second terminal of the second capacitor C2 is grounded.

In practice, a resistance value of the first resistor R1 is equal to a resistance value of the second resistor R2, and a capacitance value of the first capacitor C1 is equal to a capacitance value of the second capacitor C2. Accordingly, when the capacitance value is relatively large, the ripple of the DC voltage is relatively small. In contrast, when the capacitance value is relatively small, the ripple of the DC voltage is relatively large.

Moreover, the RC low-pass filter may further include a third capacitor NC. The third capacitor NC and the second capacitor C2 are connected in parallel. The load 310 can be equivalent to an electronic switch, as shown in FIG. 3.

For example, a Table 1 of values for the first resistor R1, the first capacitor C1, the second resistor R2 and the second capacitor C2 is shown below:

TABLE 1

| R1; R2 (ohm) | C1; C2 | $f_{clk}$; $f_{PWM}$ |
|---|---|---|
| 50; 21.5 k | 100 nF; 21.5 pF | 100 MHz; 390 kHz |

Furthermore, a Table 2 of output results of DC voltages of the filter circuit 120 is shown below:

TABLE 2

| Duty Cycle | 9/256 | 16/256 | 126/256 | 128/256 | 130/256 | 240/256 | 255/256 |
|---|---|---|---|---|---|---|---|
| Ideal Voltage | 0.17578 (V) | 0.3125 (V) | 1.4609 (V) | 2.5 (V) | 3.539 (V) | 4.6875 (V) | 5.9806 (V) |
| Measured Voltage | 1.171 (V) | 0.31 (V) | 2.409 (V) | 2.5 (V) | 2.539 (V) | 4.709 (V) | 5.015 (V) |

TABLE 2-continued

| Ripple | 23 (mV) | 26 (mV) | 50 (mV) | 50 (mV) | 50 (mV) | 24 (mV) | 22 (mV) |
|---|---|---|---|---|---|---|---|
| Transient Time | 21.5 (µs) | 22 (µs) | 30.5 (µs) | 30.6 (µs) | 30.8 (µs) | 33 (µs) | 34 (µs) |

It should be noted that above values shown in Tables 1 and 2 for illustrative purposes only. Those with ordinary skill in the art may flexibly choose parameters depending on the desired application.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112(f). In particular, the use of "step of" in the claims herein is not intended to invoke the provisions of 35 U.S.C. §112(f).

What is claimed is:

1. A testing apparatus for providing per pin level setting, the testing apparatus comprising:
    a pin driver and pin receiver having an input, and an output connected to a tested circuit;
    a filter circuit connected to the input of the pin driver and pin receiver; and
    a control unit comprising:
        a field programmable gate array (FPGA) for providing a pulse width modulation (PWM) signal; and
        at least one inverter having an input terminal in direct contact with the FPGA for receiving the PWM signal, and an output terminal in direct contact with the filter circuit, so that the filter circuit receives the PWM signal form the output terminal of the at least one inverter and outputs at least one direct current (DC) voltage to the input of the pin driver and pin receiver,
    wherein the FPGA of the control unit is connected to the filter circuit via the inverter, and the FPGA of the control unit does not receive any signal fed back from the filter circuit.

2. The testing apparatus of claim 1, wherein the pin driver and pin receiver receives the DC voltage so as to test a tested circuit.

3. The testing apparatus of claim 1, wherein the filter circuit is a low-pass filter for attenuating a high frequency portion of the PWM signal and outputting the DC voltage.

4. The testing apparatus of claim 3, wherein the low-pass filter is a RC low-pass filter.

5. The testing apparatus of claim 4, wherein the RC low-pass filter comprises:
    a first resistor, wherein a first terminal of the first resistor is connected to an output terminal of the control unit;
    a first capacitor, wherein a first terminal of the first capacitor is connected to a second terminal of the first resistor, and a second terminal of the first capacitor is grounded;
    a second resistor, wherein a first terminal of the second resistor is connected to the first terminal of the first capacitor; and
    a second capacitor, wherein a first terminal of the second capacitor is connected to a second terminal of the second resistor and a load, and a second terminal of the second capacitor is grounded.

* * * * *